United States Patent [19]
Wojnarowski

[11] Patent Number: 5,949,133
[45] Date of Patent: Sep. 7, 1999

[54] SEMICONDUCTOR INTERCONNECT STRUCTURE FOR HIGH TEMPERATURE APPLICATIONS

[75] Inventor: Robert John Wojnarowski, Ballston Lake, N.Y.

[73] Assignee: General Electric Company, Schenectady, N.Y.

[21] Appl. No.: 08/815,546

[22] Filed: Mar. 12, 1997

Related U.S. Application Data

[62] Division of application No. 08/566,624, Dec. 4, 1995, Pat. No. 5,672,546.

[51] Int. Cl.⁶ .......................... H01L 23/495; H01L 23/04; H01L 23/14; H01L 23/34
[52] U.S. Cl. .......................... 257/668; 257/678; 257/698; 257/702; 257/723; 257/725
[58] Field of Search .................... 257/678, 698, 257/700, 707, 729, 750, 758, 668, 759, 723, 763, 702, 764, 725, 522; 156/239, 298, 643; 364/490

[56] References Cited

U.S. PATENT DOCUMENTS

| | | | |
|---|---|---|---|
| 4,289,846 | 9/1981 | Parks et al. | 437/182 |
| 4,418,470 | 12/1983 | Naster et al. | 437/40 |
| 4,722,914 | 2/1988 | Drye et al. | 437/213 |
| 4,783,695 | 11/1988 | Eichelberger et al. | 257/698 |
| 4,835,704 | 5/1989 | Eichelberger et al. | 364/490 |
| 4,894,115 | 1/1990 | Eichelberger et al. | 156/643 |
| 4,933,042 | 6/1990 | Eichelberger et al. | 156/239 |
| 5,102,829 | 4/1992 | Cohn | 437/209 |
| 5,149,662 | 9/1992 | Eichelberger | 437/209 |
| 5,188,984 | 2/1993 | Nishiguchi | 437/209 |
| 5,198,385 | 3/1993 | Devitt et al. | 257/698 |
| 5,306,670 | 4/1994 | Mowath et al. | 437/209 |
| 5,348,607 | 9/1994 | Wojnarowski et al. | 156/298 |
| 5,353,498 | 10/1994 | Fillion et al. | 437/209 |
| 5,524,339 | 6/1996 | Borowitz et al. | 437/209 |
| 5,525,834 | 6/1996 | Fischer et al. | 257/698 |
| 5,548,099 | 8/1996 | Cole, Jr. et al. | 437/209 |

*Primary Examiner*—Steven H. Loke
*Attorney, Agent, or Firm*—Ann M. Agosti; Jill M. Breedlove

[57] ABSTRACT

A circuit module includes at least one high temperature semiconductor chip having chip pads; a substrate having substrate metallization, the chip pads and the substrate metallization being substantially planar; and a deposited flexible pattern of electrical conductors capable of withstanding high temperatures and coupling selected chip pads and portions of the substrate metallization. The deposited flexible pattern of electrical conductors includes a plurality of integral interconnect segments, at least one of the integral interconnect segments including first and second leg portions and a shelf portion with the shelf portion being spaced apart from the at least one semiconductor chip and substrate and being coupled by the first leg portion to a selected chip pad and by the second leg portion to one of another selected chip pad or a selected portion of the substrate metallization.

5 Claims, 6 Drawing Sheets

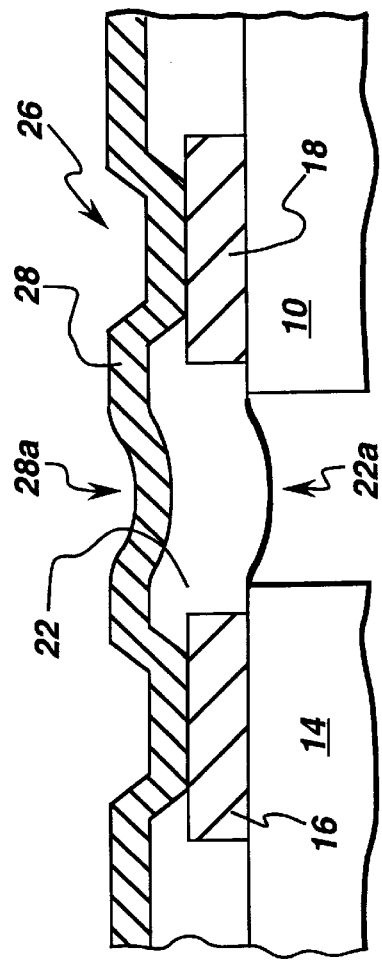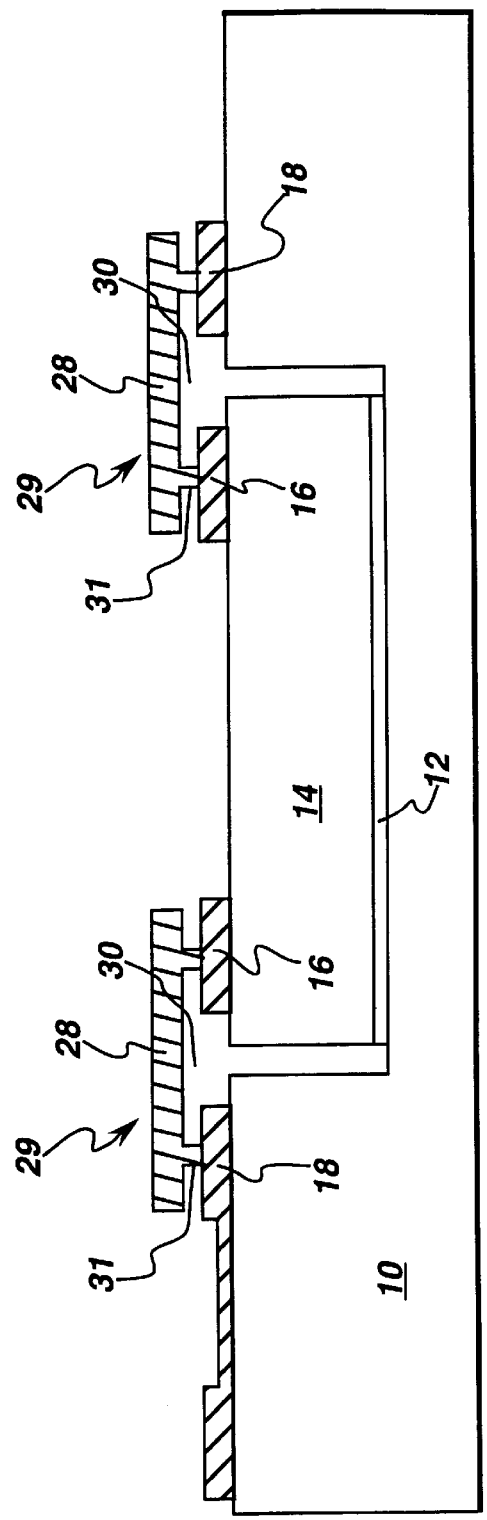

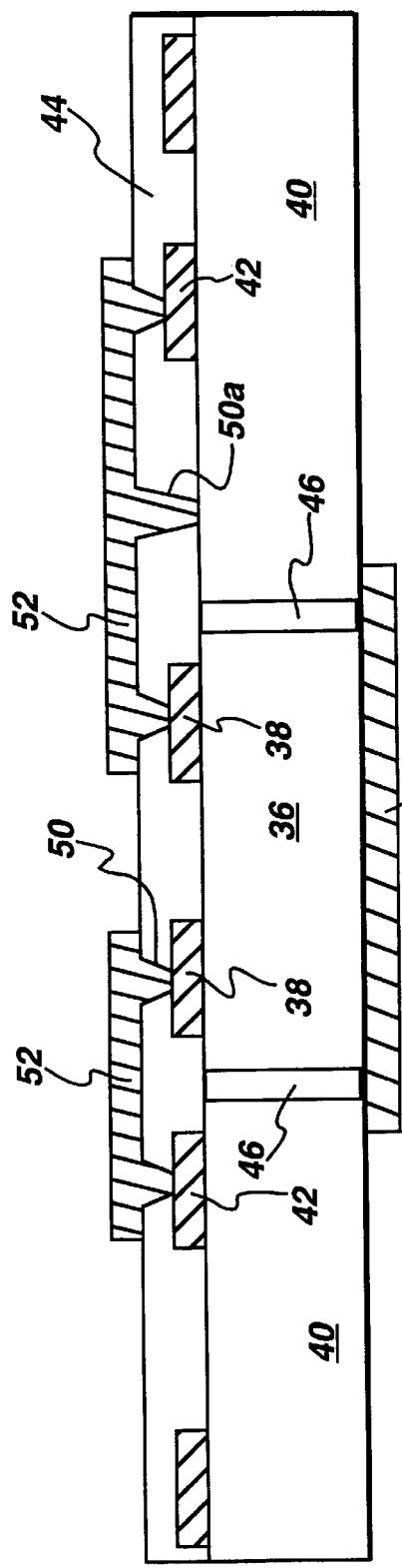
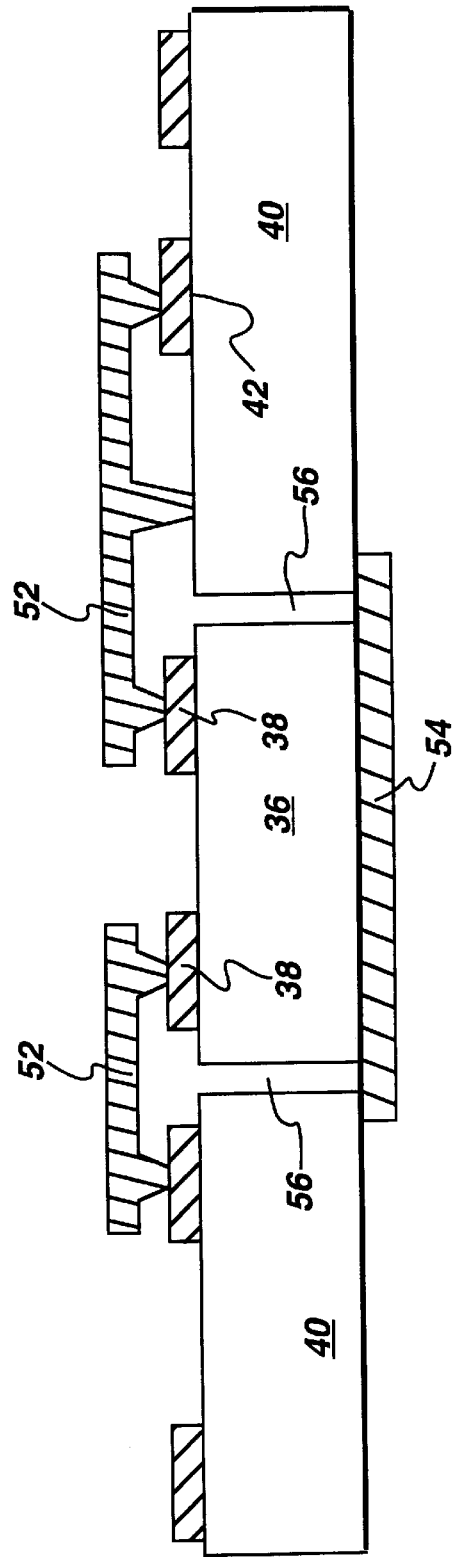

SEMICONDUCTOR INTERCONNECT STRUCTURE FOR HIGH TEMPERATURE APPLICATIONS

This is a division of application Ser. No. 08/566,624, filed Dec. 4, 1995, now U.S. Pat. No. 5,672,546.

BACKGROUND OF THE INVENTION

Wire bonding techniques for interconnecting high temperature die materials such as silicon carbide can be unreliable because the mechanical joints of wire bonds are not designed for use in temperatures exceeding about 150° C. and tend to degrade at temperatures above 200° C.

Another limitation of wire bonding is the fact that high temperature metals such as molybdenum are not compatible with conventional wire bonding. Aluminum has been added to the molybdenum in an attempt to create a wire bondable region, but the bonds remain unreliable at high temperatures.

In one form of high density interconnect (HDI) circuit module, an adhesive-coated polymer film overlay having via openings covers a substrate which can support integrated circuit chips in chip wells. The polymer film provides an insulated layer upon which is deposited a metallization pattern for interconnection of substrate metallization and/or individual circuit chips through the vias. Methods for performing an HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Generally a plurality of polymer film overlays and metallization patterns are used.

This type of HDI circuit module provides efficient use of space and flexibility of interconnection patterns. However, most polymers are not capable of withstanding sustained high temperatures such as 300° C. and above without severe degradation.

SUMMARY OF THE INVENTION

It would be advantageous to have a fabrication process that both interconnects semiconductor die efficiently and is capable of withstanding continuous high temperature environments. In the present invention, a temporary laminate structure with a removable polymer layer is used to facilitate deposition of metallization patterns, and the polymer layer is later removed (dissolved or otherwise etched away). The present invention is especially useful with semiconductor die comprising materials such as silicon carbide, for example, which are able to withstand high temperatures.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 3 and 3a are the enlarged partial view of the polymer layer and pattern of electrical conductors shown in FIG. 2.

FIG. 4 is a view similar to that of FIG. 2 showing the substrate, chip and pattern of electrical conductors after the polymer layer has been removed.

FIG. 7 is a view similar to that of FIG. 6 after the chip and substrate have been turned over and a pattern of electrical conductors has been applied.

FIG. 8 is a view similar to that of FIG. 7 after the removal of the buffer material.

DETAILED DESCRIPTION OF PREFERRED EMBODIMENTS OF THE INVENTION

Figure 1:
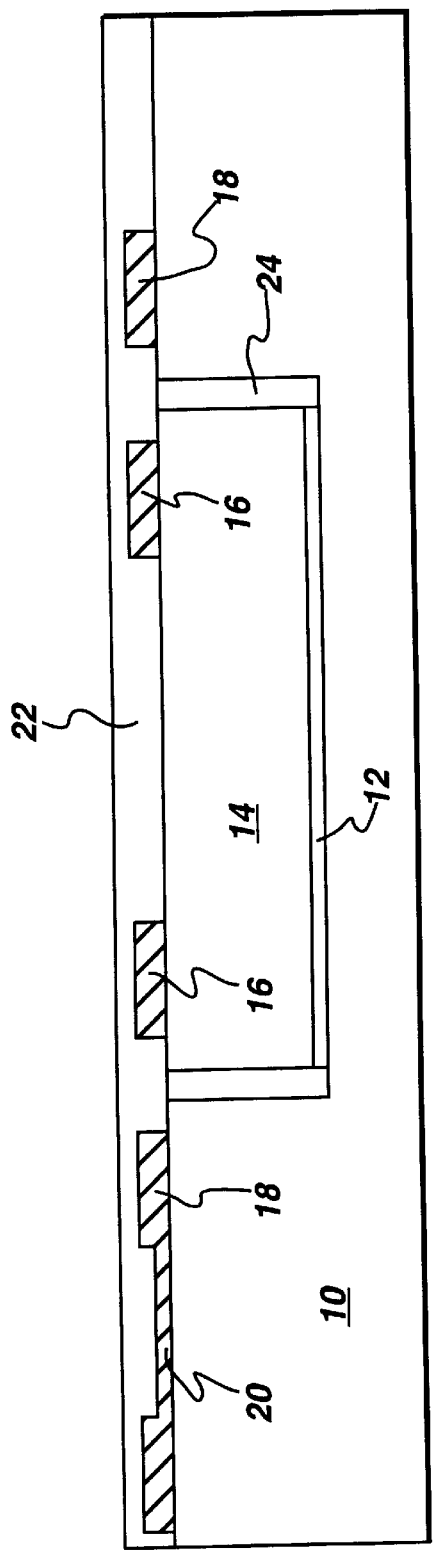
FIG. 1 is a sectional side view of a polymer layer overlying a substrate supporting a chip in a chip well.

FIG. 1 is a sectional side view of a removable polymer layer 22 overlying a substrate 10 supporting a semiconductor chip 14 in a chip well 24. The substrate comprises a suitable structural material which can withstand a high temperature environment. Preferably the substrate comprises a ceramic material such as alumina, for example. The substrate can optionally include substrate metallization 18 and 20 thereon to facilitate further interconnections. The substrate can further include, if desired, multiple layers of ceramic having metallization patterns therebetween (not shown).

Chip 14 preferably comprises a semiconductor die or device capable of operation in a high temperature environment, and in one embodiment the chip comprises silicon carbide. The substrate metallization 18 and chip pads 16 are substantially planar to reduce potential stresses on the later applied pattern of electrical conductors and both may comprise metals capable of withstanding high temperatures. Appropriate metals include alloys such as titanium/tungsten and composite layers such as titanium coated with molybdenum, for example. The chip can be attached to the substrate using a high temperature chip attach material 12 which may comprise a solder-braze reflow material, for example.

Polymer layer 22 comprises a dissolvable material such as a polyester, a solder resist, or ULTEM™ polyetherimide resin (ULTEM is a trademark of General Electric Company), for example. If polymer layer 22 comprises a polyetherimide resin, preferably a layer having a thickness ranging from 0.3 mils to 5 mils is laminated in a vacuum chamber.

Figure 2:
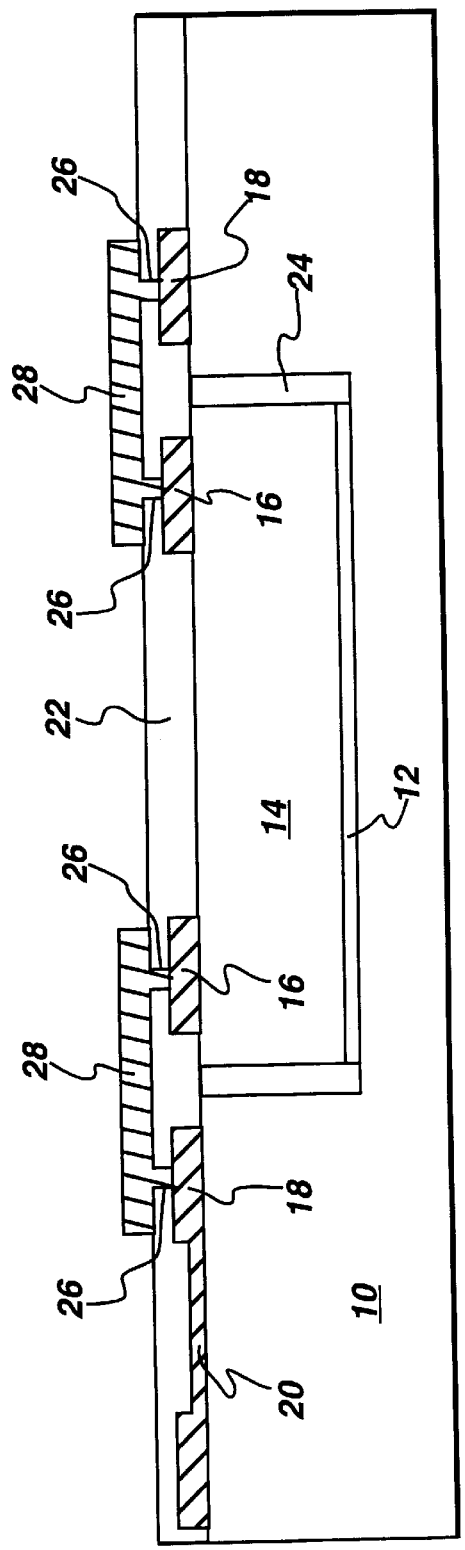
FIG. 2 is view similar to that of FIG. 1 further showing vias in the polymer layer and a pattern of electrical conductors extending through the vias.

FIG. 2 is view similar to that of FIG. 1 further showing vias 26 formed in the polymer layer and a pattern of electrical conductors 28 extending through the vias. The vias can be formed by any appropriate method and in one embodiment are laser ablated by a technique such as described in Eichelberger et al., U.S. Pat. No. 4,894,115, issued Jan. 16, 1990.

The via holes can then be plasma ashed (or reactive ion etched) with a 20% $CF_4$ and 80% $O_2$ solution to remove any carbonized polymer debris and to clean the surfaces of the exposed chip pads and substrate metallization. The exposed chip pads and substrate metallization can be back sputtered for further cleaning.

Preferably the surface area of each bottom of a via hole will be as large as possible so as to aid in establishing a strong mechanical and electrical contact. In one embodiment wherein the chip pads have sides ranging from two to five mils, the via holes have square bottoms with sides ranging from one to four mils.

Pattern of electrical conductors 28 can be applied, for example, by sputter depositing high temperature metals under vacuum conditions. Metals which can adhere well to underlying chip pads and substrate metallization and can withstand high temperatures include alloys such as titanium/ tungsten and composite layers such as titanium coated with molybdenum, for example.

Typically the total thickness of the metallization ranges from two to twenty micrometers, with an underlying seed layer portion having a thickness of about 1000 Å. The minimum required thickness of the metallization depends on the amount of current expected, as well as the width of metallization runs in the pattern of electrical conductors.

Depending on the thickness of the pattern of electrical conductors and the properties of polymer layer 22, it may be preferable to sputter the metallization in several stages with cooling periods in between to avoid melting or distorting the polymer layer. Patterning of the applied metallization can be accomplished using conventional photoresist and etching techniques. Mask patterning can be used for batch manufacturing. Metallization patterning can be controlled precisely using a technique such as the adaptive lithography described in Eichelberger et al., U.S. Pat. No. 4,835,704, issued May 30, 1989.

Figure 3A:
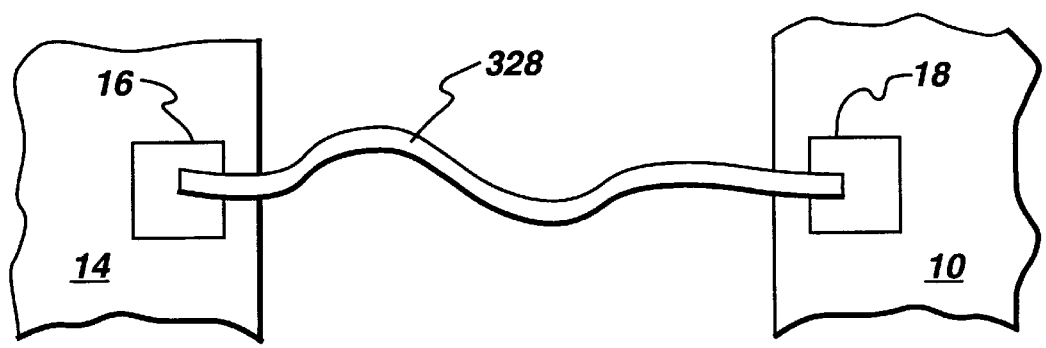

FIG. 3 is an enlarged partial view of polymer layer 22 and pattern of electrical conductors 28 shown in FIG. 2. Although FIGS. 1–2, 4, and 6–8 show the polymer layer and pattern of electrical conductors as being flat, in practice, a slight dip 22a will typically be present in the area between chip 14 and substrate 10 after the attachment of the polymer layer. This will create a corresponding dip 28a in the pattern of electrical conductors. This dip is useful because it provides a stress relieving structure which has increased length and flexibility to accommodate differences which may exist in the coefficients of thermal expansion of the chip and substrate. As shown in FIG. 3a, another method for increasing flexibility is to use longer line patterns, such as S-shaped lines (which are shown as portions of the pattern of electrical conductors 28 in FIG. 5), instead of straight lines FIG. 4 is a view similar to that of FIG. 2 showing the substrate 10, chip 14, and pattern of electrical conductors 28 after the polymer layer has been removed. The polymer layer can be removed by any appropriate process, and in one embodiment is removed by dissolution in a solvent. When the polymer layer comprises a polyetherimide resin, for example, the polymer layer can be dissolved using methylene chloride, anisole, n-methyl-pyrrolidone, acetophenone, ortho dichloro benzene, cresol, cresylic acid, and concentrated sulfuric acid. The reactivity of the polymer layer in a solvent is typically increased by heating, so it is useful to apply the solvent using a hot spray technique, for example. Polymer removal approaches which do not require solvents include plasma etching and RIE (reactive ion etching), for example.

After the polymer layer has been removed, the pattern of electrical conductors becomes a plurality of integral interconnect segments each having a shelf portion 29 spaced apart from the chip and substrate and coupled to the chip and/or substrate metallization by leg portions 31 which remain in the prior locations of vias which had been formed in the polymer layer.

Although the description of FIGS. 1–4 has been in terms of a single polymer layer and pattern of electrical conductors, a structure having multiple layers of electrical conductor patterns can easily be fabricated by these same techniques so that one or more additional patterns of electrical conductors are coupled to the first pattern. An additional polymer layer (not shown) overlying the first polymer layer and pattern of electrical conductors would need to have a thickness sufficient to prevent any shorting between by the additional pattern of electrical conductors after the polymer layers are removed.

Figure 5:
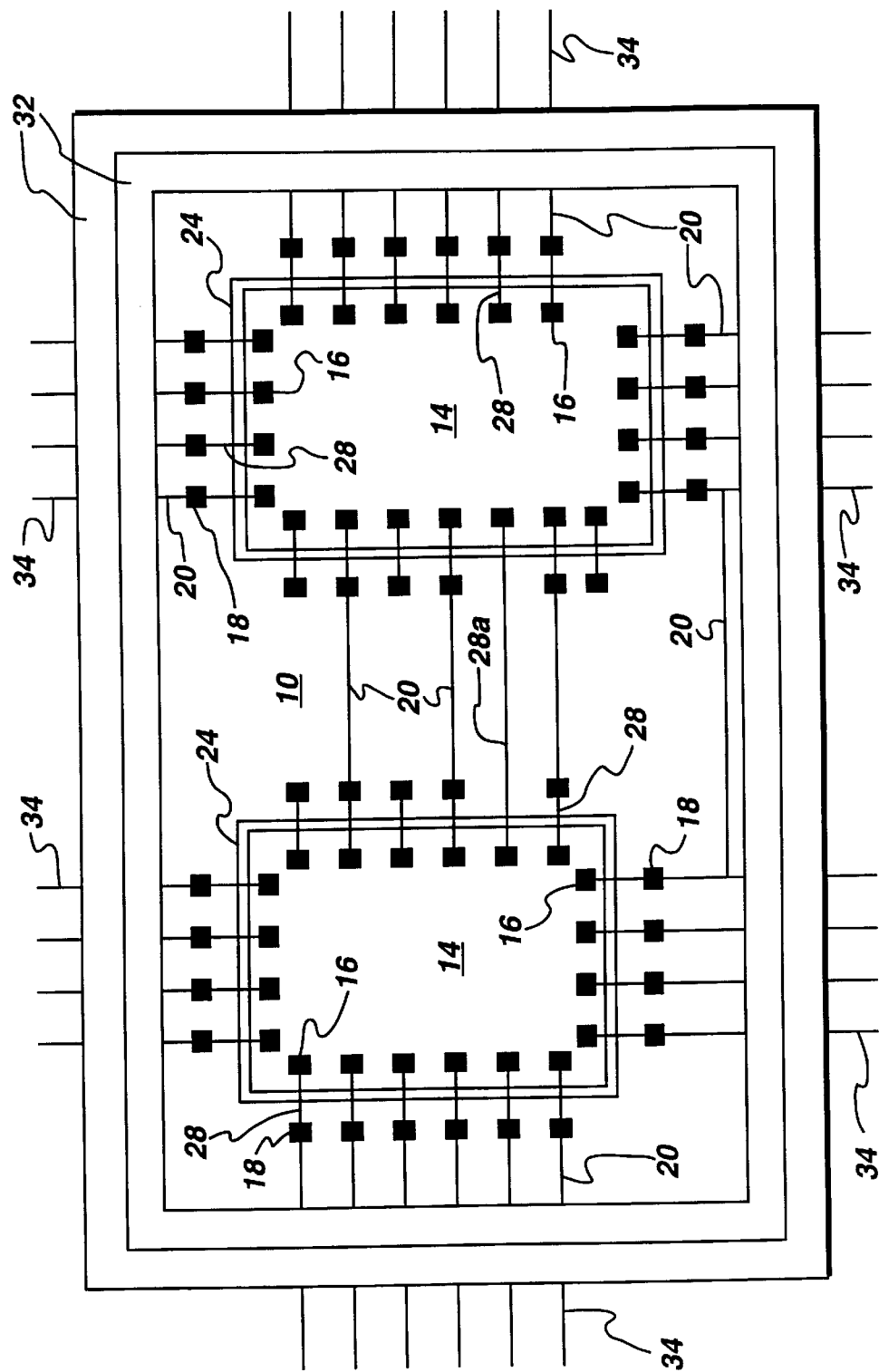
FIG. 5 is a top view of several chips interconnected using the approach shown in FIGS. 1–4.

FIG. 5 is a top view of several chips 14 interconnected using the approach shown in FIGS. 1–4. Each chip can be coupled to substrate metallization 18 and 20 which in turn can be coupled to another chip or through a seal ring 32 to other metallization runs 34, for example. Alternatively, chip pads of the chips can be coupled directly together through a portion 28a of the pattern of electrical conductors 28.

Figure 6:
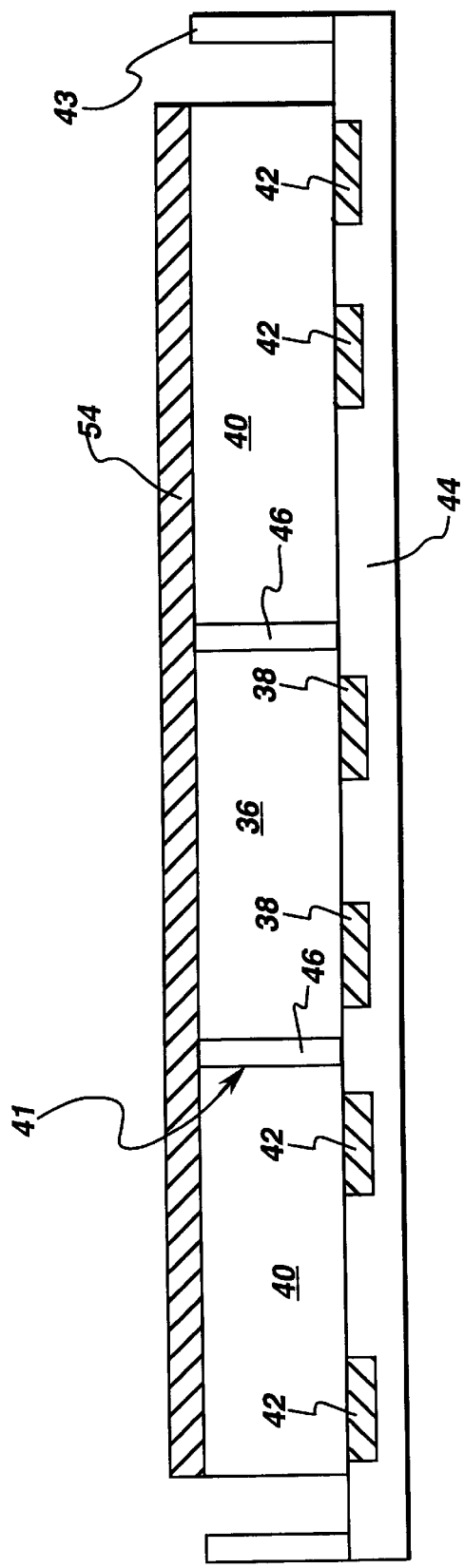
FIG. 6 is a sectional side view of a chip within a substrate through hole with buffer material disposed between the chip and substrate and a deposited metallization plane on the backside of the chip.

FIG. 6 is a sectional side view of a high temperature semiconductor chip 36 within a substrate 40 through hole 41 with buffer material 46 between the chip and substrate and a deposited metallization plane 54 on the backside of the chip.

In one embodiment, a removable polymer layer 44 is kept substantially planar by a frame 43. Polymer layer 44 may comprise materials such as those described with respect to polymer layer 22 of FIG. 1. The substrate is then positioned on the removable polymer layer, and the semiconductor chip is inserted in the through hole with chip pads 38 facing the removable polymer layer. The polymer layer can be heated for softening (if needed) to provide adhesion of the polymer layer to the semiconductor chip and the substrate, and the polymer layer can later be solidified. As described by Wojnarowski et al., U.S. Pat. No. 5,348,607, issued Sep. 20, 1994, for example, in one method in which heating is not required, chips are attached to a surface with glue and the surface is then coated with a solvented thermoplastic polymer solution and dried.

Buffer material 46 is inserted between the chip and the substrate to prevent metallization plane 54 from extending too deep in the through hole between the chip and the substrate. The buffer material need not extend through the entire space between the chip and substrate. In fact, it is useful to not fill the through hole completely with buffer material so that dips such as those discussed with respect to FIG. 3 can be formed to increase the flexibility of the pattern of electrical conductors.

In one embodiment, the buffer material is injected after the chip and substrate are positioned on polymer layer 44. The buffer material comprises a removable material, preferably in a form capable of being poured. If the buffer material is poured as a liquid, it can then be solidified. For ease of later removal, it is convenient if the buffer material comprises material the same as the polymer layer or is otherwise capable of simultaneous removal. In one embodiment, the buffer material comprises a polyetherimide resin.

The substrate/buffer material/chip surface can be cleaned and or planarized by a process such as grinding or plasma etching which preferably occurs at a point in time when the buffer material is solid. These processes are useful in the event that buffer material has spilled on the substrate or chip, or in the event that the surfaces are non-planar.

Metallization plane 54 can be applied as discussed with respect to pattern of electrical conductors 28 of FIG. 2 in a similar manner with high temperature metals having low coefficients of thermal expansion such as titanium/tungsten and titanium coated with molybdenum. Because the metallization plane is adjacent the chip and substrate it need not be as thick as the pattern of electrical conductors, and in one embodiment the thickness is about 10 micrometers. The metallization plane can be applied by techniques such as sputtering, plasma spraying, and/or electroplating. The metallization plane may be left as a blanket coating on the substrate and chip, or, if desired, the metallization plane can be patterned in area around the chip, as shown in FIGS. 7 and 8.

The buffer material and metallization plane need not be applied in the specific sequence described above. For example, the buffer material and metallization may be added after applying pattern of electrical conductors 52 or, alternatively, before applying polymer layer 44, if desired.

FIG. 7 is a view similar to that of FIG. 6 after the chip and substrate have been turned over and pattern of electrical conductors 52 has been applied. Vias 50 and pattern of electrical conductors 52 can be formed in the manner discussed with respect to vias 26 and pattern of electrical conductors 28 of FIG. 2. FIG. 7 further illustrates the use of an additional via 50a for structural support purposes (instead of for interconnection to a chip pad or substrate metallization). Such additional via is especially useful for any long portions of the pattern of electrical conductors.

FIG. 8 is a view similar to that of FIG. 7 after the removal of polymer layer 44 and buffer material 46. The polymer layer can be removed by processes such as those discussed with respect to FIG. 4. If the buffer material is the same as or compatible with the polymer layer, the buffer material can be removed simultaneously by a single solvent. To aid in removal of the buffer material, techniques such as solvent warmed plasma etching and high heat firing can be used.

Metallization plane 54 provides a useful bond for attaching the chip and substrate which can be more reliable than the high temperature chip attach material 12 of FIG. 2 and does not require brazing, solder flux, or any other high temperature technique for chip attach. Furthermore, the metallization plane, especially if patterned as shown in FIGS. 7 and 8, offers increased flexibility for varying coefficients of thermal expansion between the chip and substrate.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A circuit module comprising:
   at least one high temperature semiconductor chip having chip pads; and
   a deposited flexible pattern of electrical conductors capable of withstanding high temperatures and coupling selected chip pads, the deposited flexible pattern of electrical conductors comprising a plurality of integral interconnect segments, at least one of the integral interconnect segments including first and second leg portions and a shelf portion, the shelf portion being spaced apart from the at least one semiconductor chip without an insulating material therebetween and being coupled by the first leg portion to a first selected chip pad and by the second leg portion to a second selected chip pad.

2. The module of claim 1, wherein the deposited flexible pattern of electrical conductors includes S-shaped conductor line patterns.

3. The module of claim 1, wherein the deposited pattern of electrical conductors includes dips in conductor line patterns.

4. The module of claim 1 wherein the at least one high temperature semiconductor chip comprises at least two high temperature semiconductor chips and wherein the shelf portion is coupled by the first leg portion to a selected chip pad of a first one of the at least two high temperature semiconductor chips and by the second leg portion to a selected chip pad of a second one of the at least two high temperature semiconductor chips.

5. A circuit module comprising:
   at least one high temperature semiconductor chip having chip pads;
   a substrate having substrate metallization, the chip pads and the substrate metallization being substantially planar; and
   a deposited flexible pattern of electrical conductors capable of withstanding high temperatures and coupling selected chip pads and portions of the substrate metallization, the deposited flexible pattern of electrical conductors comprising a plurality of integral interconnect segments, at least one of the integral interconnect segments including first and second leg portions and a shelf portion, the shelf portion being spaced apart from the at least one semiconductor chip and substrate without an insulating material therebetween and being coupled by the first leg portion to a selected chip pad and by the second leg portion to the substrate metallization, wherein the one of the integral interconnect segments further includes a third leg portion extending from the shelf portion to the substrate for structural support of the one of the integral interconnect segments.

* * * * *